METHOD OF MAKING PALLADIUM COPPER CONTACT FOR SOLDERING

Filed Sept. 7, 1966

INVENTORS
R.F. BREWER
B. PIECHOCKI
BY R. P. Miller
ATTORNEY 3,413,711
Patented Dec. 3, 1968

3,413,711

METHOD OF MAKING PALLADIUM COPPER CONTACT FOR SOLDERING

Robert F. Brewer and Benjamin Piechocki, Bethlehem, Pa., assignors to Western Electric Company, New York, N.Y., a corporation of New York Filed Sept. 7, 1966, Ser. No. 577,743
4 Claims. (Cl. 29—473.1)

This invention relates to palladium copper solder terminations and methods of manufacture thereof, and more particularly to a readily solderable contact termination and methods of manufacture wherein the termination comprises a layer of palladium of sufficient thickness to prevent oxidation of an underlying copper layer, and wherein the thickness is limited so that the palladium goes into solution upon application of solder to connect a wire or ribbon lead to the termination.

In the manufacture of thin film circuits, it is necessary to attach or solder wire leads or metallic ribbon and terminals to various sections of circuits. One solder contact termination or pad that has been utilized comprises successive layers of a nickel-chromium alloy, copper, and palladium. Copper by itself does not adhere strongly to tantalum or certain other materials used in the manufacture of thin film circuitry; therefore, a nickel-chromium alloy layer is used because this alloy will readily adhere to both the thin film circuit and the superimposed copper layer. Copper is used as a layer because of its good solderability characteristics, as well as good electrical conductivity characteristics to decrease the overall resistivity of the termination, particularly at the junction with a solder. An overlying layer of palladium is used to protect the copper surface by preventing oxidation of the copper. In order to connect a wire lead or metallic ribbon to such a contact termination, various solders may be used that have an affinity for and will adhere to copper.

However, these prior contact terminations were weak in that soldered wire leads were easily separated from the termination upon application of pull forces to the wire leads. Further, with these prior terminations, excessive amounts of precious metal, such as palladium, were required because it was thought that a considerable amount of palladium was needed to insure the adhesion and strength of the soldered connection.

More specifically, in the prior manufacture of one such termination, a copper layer of 6000 A. thickness was deposited on the termination area, followed by the deposition of a layer of palladium with a thickness of 2000 A. Upon application of mechanical pull forces to leads soldered onto these terminations revealed a significant number of failures.

An object of this invention is to provide a new and improved copper palladium termination which adheres to a thin metallic film and provides a termination to which a wire lead may be soldered with strong adhesion characteristics.

Concomitant with this object it is a further object of the invention to provide a method wherein a wire lead may be soldered to a termination formed on a section of a thin film circuit.

An additional object of this invention is to provide a palladium copper contact termination wherein a layer of palladium is deposited on a layer of copper so that oxidation of the copper is precluded while only enough palladium is provided so that all of the palladium goes into a solid solution upon the subsequent application of solder to attach a wire lead to the termination.

Another object of this invention resides in passing a palladium copper termination together with a wire lead or metallic ribbon through a solder wave whereupon the solder adheres to the termination to dissolve the palladium and form a strong atomic bond with the underlying layer of copper.

With these and other objects in view, the present invention contemplates a method of strongly adhering a soldered wire lead or metallic ribbon to a termination pad composed of successive layers of nickel-chromium alloy, copper, and palladium deposited on a section of a thin film circuit. More particularly, the nickel-chromium alloy layer is deposited on the termination section of the circuit and then a relatively thick layer of copper is deposited, followed by the deposition of a relatively thin layer of palladium. The thickness of the copper being about twenty times as thick as the palladium which is in the range of 500–750 A. thickness. A wire lead or metallic ribbon is paced in a suitable fixture and held against the termination pad to leave the pad and wire lead exposed. Next, the thin film circuit, which is formed on a suitable substrate, is passed circuit side down through a vertically flowing wave of solder heated to a temperature of approximately 400° F. The solder wave dissolves the palladium and exposes the unoxidized copper surface. The solder thus contacts and strongly alloys to the clean non-oxidized surface of the underlying copper layer to provide a strong soldered connection between the wire lead and the thin film circuit.

Other objects and advantages of the present invention will be apparent from the following detailed description when considered in conjunction with the accompanying drawing wherein.

Figure 1:
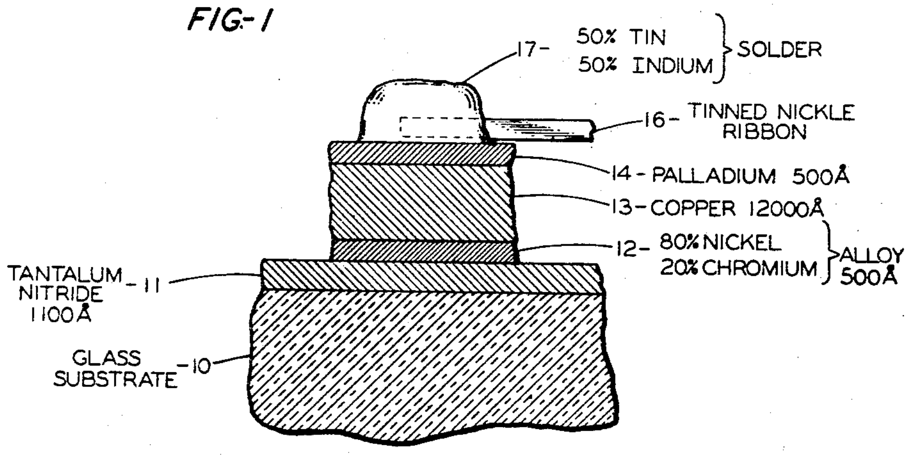
FIG. 1 is a side elevational view, partially in section, showing a multilayer termination pad with a wire lead soldered thereon in accordance with the principles of the invention.

Referring first to FIG. 1, there is shown a substrate 10 on which is deposited a thin film or layer 11 of tantalum nitride or tantalum. The thin film 11 may be deposited in thickness from 400 A. to 1400 A. by a cathodic sputtering process. The configuration of the thin film may consist of a series of intersecting, relatively long circuit paths. However, this thin film may also be of a relatively short length and deposited on a substrate and then subsequently anodized to form a resistor, such as described in the patent to D. Gerstenberg No. 3,242,006 issued Mar. 22, 1966. The substrate is constructed of glass or ceramic material, e.g. an alumino-boro-silicate glass.

In order to connect other circuit components, modules and sources of electrical energy, it is necessary to provide soldered wire lead connections to the tantalum nitride thin film circuit path or resistor. Commercial solders such as mixtures of tin and indium, and tin and lead do not adhere to the surface of the tantalum nitride nor do these solders adhere to circuit paths of tantalum and other compounds of tantalum. Solder connections can only be made by providing termination pads on sections or areas of the circuit path to which it is desired to attach wire leads.

Previously, attempts have been made to provide suitable termination pads consisting of either successive layers of a nickel-chromium alloy, copper and palladium or merely successive layers of a nickel-chromium alloy and palladium. Leads have been soldered to these termination pads with varying degrees of success. In construction, a termination pad may be built up by vacuum depositing the successive layers as vapors in evaporation chambers, or the layers may be deposited by electroplating processes. An apparatus suitable for depositing the successive layers of metal is disclosed in a copending application to R. A. Pudliner, Ser. No. 493,691, filed Oct. 7, 1965 and entitled "Apparatus for Sequentially Vacuum Depositing Metal Film on Substrates." With the vacuum deposition process, vapors of the successive metal layers are deposited through an opening in a suitable mask which may be constructed of exposed photoresist material, or the mask may be constructed of an apertured, thin, flexible sheet of a metal such as molybdenum.

In FIG. 1 the deposited nickel-chromium alloy base layer is designated by the reference numeral 12, the deposited copper layer by reference numeral 13 and the deposited palladium layer by the reference numeral 14. A wire lead or metallic ribbon 16 of nickel having a pretinned finish is placed on the upper surface of the palladium layer 14 and a connection made by a molten solder 17 which may consist of tin and indium or tin and lead. The criteria for successful solder connections is determined by the ability of the termination pad to withstand the application of pull forces to a wire soldered to the pad without the pad separating from the thin film circuit path.

One termination pad that appeared to be commercially usable consisted of a layer of nickel-chromium alloy having a thickness of 250–500 A., a layer of copper having a thickness of 6000 A. and finally a layer of palladium having a thickness of about 2000 A. Wire leads or ribbons laid on the exposed surface of the palladium and soldered with a 50% tin–50% indium solder resulted, however, in a significant number of failures upon application of pull forces of about 3 pounds, that is, the termination pads separated from the circuit path.

In an attempt to improve the solder connections, it was thought that if the palladium layer was increased in thickness and the copper layer eliminated, then the resultant pad would improve the pull test characteristics of the soldered connection. Several such termination pads were constructed with different thicknesses of palladium, but there was still a significant number of failures in the soldered connection upon subjecting the terminal lead to pull forces of about 3 pounds. In other tests, using intermediate deposited layers of copper of 6000 A. thickness, the thickness of the palladium layer was increased, but the termination pads did not reveal any significant improvements when subjected to pull tests on the soldered leads.

Another approach used in an attempt to increase the pull strength characteristics of the termination pads was to increase the thickness of the copper layer and also increase the palladium layer, but again a significant number of failures were encountered.

It was only when the normal thickness of copper was increased and the thickness of the palladium was decreased that an improvement was unexpectedly noted. Construction of further samples with decreasing thicknesses of palladium, revealed that the percentage of satisfactory termination pads increased. Finally, it was discovered that termination pads having a copper layer thickness of at least 12,000 A. and palladium layers having a thickness in the range of from 500 A. to 750 A. resulted in nearly 100% satisfactorily soldered connections upon subsequent subjection to the pull tests.

Figure 2:
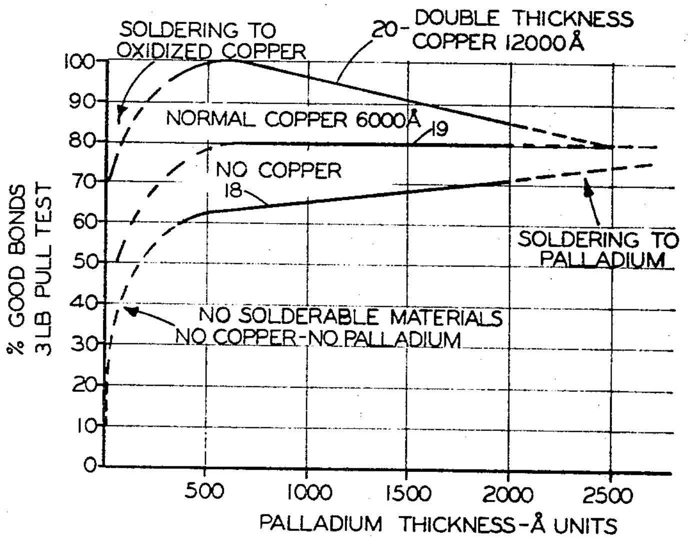
FIG. 2 is a graph illustrating the percent acceptability of soldered wires on termination pads with various thickness of the different significant layers of metals.

In FIG. 2 there is shown a graphical representation of the percentage of good bonds (bonds able to withstand the 3 pound pull tests) plotted with relation to the thickness of palladium on three different termination pads. These pads were characterized in that in pads depicted by curve 18 had no intermediate copper layer; the pads depicted by curve 19 had a normal intermediate copper layer of 6000 A. thickness; and the pads depicted by curve 20 had a double thickness copper layer of 12,000 A. thickness.

A succession of tests with intermediate amounts of copper of greater than 12,000 A. thickness revealed no further change in the test results, so long as the thickness of palladium layer was maintained within the critical range of 500 A. to 750 A. In all these tests there were practically 100% good bonds.

It is believed that the good bonds result from the fact that during the soldering, all of the palladium goes into solution with the solder so that the unoxidized underlying copper surface is presented to the solder composition. The solder composition readily wets and defuses into the unoxidized copper surface to form a fused complex alloy bond with the copper. It is also believed that the drop-off in the percentage of good bonds obtained when the palladium is decreased in thickness below 500 A. results from the fact that the palladium is not thick enough to protect the copper layer from oxidization. Further, the copper thickness is also important because if the copper is too thin then it will alloy and go into solution with the palladium and solder leaving a thin, relatively weak layer of copper, or leaving the nickel-chromium alloy exposed to the solder composition. It is well known that solder does not readily adhere to nickel-chromium alloys.

Figure 3:
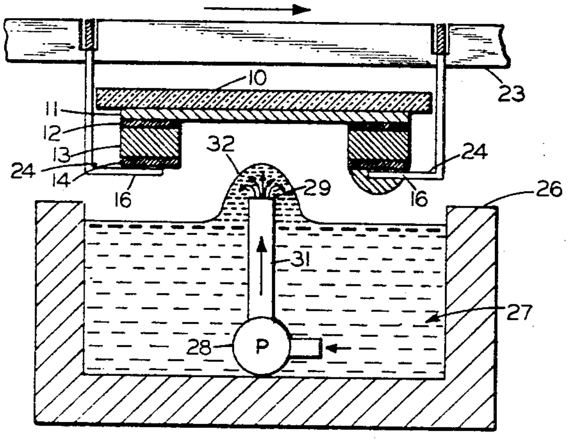
FIG. 3 shows a solder wave apparatus for applying solder to bond wire leads or metallic ribbons to a pair of termination pads of the type illustrated in FIG. 1.

A specific example of the construction of a satisfactory termination pad comprised the steps of vacuum depositing a layer of 80% nickel–20% chromium with a thickness of 500 A. on a tantalum nitride thin film which was sputtered on a glass substrate. Next, a copper layer in the thickness of 12,000 A. was vacuum deposited on the nickel-chromium layer. The pad was completed by the vacuum deposition of a layer of palladium having a thickness of 500 A. A pretinned nickel ribbon was placed on each palladium layer. Next, the overall circuit was mounted in a channeled tool steel fixture 23 along with the ribbons 16 so that L-shaped sections 24 butt the top surfaces of the palladium. The circuit and termination pad were inverted and advanced at a rate of 3½ to 4 feet per minute past a vertically emanating solder wave in the manner illustrated in FIG. 3.

More particularly, a container 26 had a pool of solder 27 consisting of 50% tin and 50% indium maintained at a temperature of approximately 400° F. A pump 28 forced the solder through a rectangular nozzle 29 of a rectangular conduit 31. The solder emanated from the nozzle 29 in the form of a rectangular cross-sectional shape wave 32. The circuit and termination pads were moved toward the right to advance the wire ribbons 16 and the termination pads through the wave. Due to the good wetting characteristics of the palladium layer, a quantity of sufficient solder adhered to the palladium surfaces to effectuate good solder bonds. More particularly, sufficient solder wets and adheres to the palladium to substantially dissolve the palladium and form a complex alloy fused bond with the underlying copper layer 13. Subsequent pull tests consisting of the application of 3 pounds pull force along the axis of a large number of soldered ribbons 16, resulted in attainment of 100% good bonds.

Other tests were run where the thicknesses of copper was greater than 12,000 A. and these tests again revealed similar good results so long as the palladium layer was maintained at a thickness of about 500 A. to 750 A.

It is to be understood that the above-described construction of a termination pad and methods of establishing good solder bonds are merely illustrative of the principles of the invention and that other modifications may be made without departing from the invention.

What is claimed is:

1. The method of soldering a metallic lead to a base of a metal other than copper, but which has an affinity for copper, which comprises:

depositing on the base a layer of copper having a thickness of at least 12,000 angstrom units;

depositing on the copper layer a layer of palladium having a thickness between 500 and 750 angstrom units; and applying solder to the metallic lead and the palladium layer to dissolve the palladium and form a bond with the underlying copper layer.

2. A method of preparing a copper termination pad on a tantalum nitride circuit path for a solder bond with a wire lead which comprises:

depositing a layer of a nickel-chromium alloy on said tantalum nitride circuit path, said deposit of nickel-chromium having a thickness of at least 250 A.;

depositing a layer of copper having a thickness of at least twenty times as great as a subsequently deposited layer of palladium to provide a base to which solder will form a bond; and depositing a layer of palladium on said copper surface having a thickness between 500 and 750 angstrom units.

3. A method as defined in claim 2, wherein the layer of copper is deposited in a thickness of at least 12,000 A.; and a lead is placed on the exposed surface of the palladium layer; and further, molten solder in a quantity and a composition sufficient to dissolve the palladium layer is applied over the lead to dissolve the palladium layer and form a bond with the underlying copper layer.

4. A method of attaching a metallic lead to a section of a thin film tantalum nitride circuit path formed on a ceramic substrate, which comprises:

depositing a layer of a 80% nickel–20% chromium alloy on said section of said circuit path;

depositing a layer of copper of at least 12,000 A. thickness on said layer of nickel-chromium alloy;

depositing a layer of palladium of 500–750 A. thickness on said layer of copper;

holding a metallic lead on said layer of palladium;

projecting a wave of solder of 50% tin and 50% indium in vertical plane at 400° F.; and passing the circuit over the solder wave with the layer of palladium and metallic lead projecting downward and exposed to the solder wave, whereupon a quantity of solder wets and dissolves the palladium and adheres to the copper to secure the lead to said copper layer.

References Cited

UNITED STATES PATENTS

| | | | |
|---|---|---|---|
| 2,702,252 | 2/1955 | Suchoff | 117—71 X |
| 2,819,961 | 1/1958 | Bartels | 29—504 X |
| 2,984,893 | 5/1961 | Spooner | 29—498 X |
| 2,993,272 | 7/1961 | Carlzen | 29—503 |
| 3,107,422 | 10/1963 | Eckermann | 29—492 |
| 3,162,512 | 12/1964 | Robinson | 29—199 |
| 3,242,006 | 3/1966 | Gerstenberg | 338—308 X |
| 3,258,898 | 7/1966 | Garibotti | 117—217 X |
| 3,298,802 | 1/1967 | Odekerken | 29—199 X |
| 3,310,858 | 3/1967 | Johnston | 29—492 X |
| 3,339,267 | 9/1967 | Bronnes | 29—473.1 |

OTHER REFERENCES

A New Thin Film Transmission Line, by R. W. Wyndrum and D. Mills, Bell Laboratories Record, Sept. 1965, vol. 43, pp. 328–331.

A Technique of Soldering to Thin Metal Films, by Richard Belser, The Review of Scientific Instruments vol. 25, No. 2, Feb. 1954.

Chemically Planting a Dielectric Base by D. A. Radowsky. I.B.M. Technical disclosure bulletin, vol. 4, No. 7, Dec. 1961.

JOHN F. CAMPBELL, *Primary Examiner.*

R. F. DROPKIN, *Assistant Examiner.*